(12) United States Patent
Nickerson et al.

(10) Patent No.: US 7,358,444 B2
(45) Date of Patent: Apr. 15, 2008

(54) FOLDED SUBSTRATE WITH INTERPOSER PACKAGE FOR INTEGRATED CIRCUIT DEVICES

(75) Inventors: Robert M. Nickerson, Chandler, AZ (US); Ronald L. Spreitzer, Phoenix, AZ (US); John C. Conner, Chandler, AZ (US); Brian Taggart, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 294 days.

(21) Appl. No.: 10/964,790

(22) Filed: Oct. 13, 2004

(65) Prior Publication Data

US 2006/0077644 A1    Apr. 13, 2006

(51) Int. Cl.
*H05K 1/00*    (2006.01)
(52) U.S. Cl. .................................. 174/254; 361/748
(58) Field of Classification Search ............. 174/254; 361/749–751; 439/65–75, 77
See application file for complete search history.

(56) References Cited

U.S. PATENT DOCUMENTS

| 5,321,583 | A | 6/1994 | McMahon |
| 6,245,594 | B1 | 6/2001 | Wu et al. |
| 6,255,740 | B1 | 7/2001 | Tsuji et al. |
| 6,451,627 | B1 | 9/2002 | Coffman |
| 6,469,908 | B2 | 10/2002 | Patel et al. |
| 6,548,328 | B1 | 4/2003 | Sakamoto et al. |
| 6,589,870 | B1 | 7/2003 | Katoh |
| 6,671,947 | B2 | 1/2004 | Bohr |
| 6,908,792 | B2 * | 6/2005 | Bruce et al. ............. 438/110 |
| 2003/0207492 | A1 * | 11/2003 | Maeda et al. ............. 438/107 |
| 2006/0038303 | A1 | 2/2006 | Sterrett et al. |
| 2007/0001277 | A1 | 1/2007 | Ichikawa |

OTHER PUBLICATIONS

Chipsupply.com, "Chip Scale Packaging (CSP)", [online], [retrieved on Apr. 22, 2004], retrieved from the Internet at <URL:http://www.chipsupply.com/corporate/interconnect%20solutions/chip%20scale.htm>.
Dataweek, "Stacked-CSP Delivers Flexibility, Reliability and Space-Saving Capabilities", [online], Aug. 27, 2004, [Retrieved on Jul. 14, 2004], retrieved from the Internet at <URL: http://dataweek.co.za/news.asp?pklNewsID=11744&pklIssueID=348&pklCategoryID=36>.

(Continued)

*Primary Examiner*—Jeremy C Norris
(74) *Attorney, Agent, or Firm*—Konrad Raynes & Victor LLP

(57) ABSTRACT

In one embodiment, a package-to-package stack is assembled comprising a first integrated circuit package, and a second integrated circuit package which are mechanically and electrically connected using an interposer and a substrate folded around the interposer. Other embodiments are described and claimed.

21 Claims, 6 Drawing Sheets

OTHER PUBLICATIONS

IMEC, "Advanced Packaging Technologies to Bridge the Interconnect Technology Gap", downloaded prior to Aug. 23, 2004, pp. 1-8.

Intel Corporation, "Silicon: Packaging Solutions for a Mobile Marketplace", [online], 2004, [Retrieved on Jul. 14, 2004], retrieved from the Internet at <http://www.intel.com/research/silicon/mobilepackaging.htm>.

Intel Corporation, "The Chip Scale Package (CSP)", 2000 Package Databook, 2000, Ch. 15, pp. 15-1 through 15-16.

IVF—The Swedish Institute of Production Engineering Research, "Chapter B: Flip-Chip Technology", [online], [retrieved on Apr. 22, 2004], retrieved from the Internet at <URL: http://extra.ivf.se/ngl/B-Flip-Chip/ChapterB1.htm>.

Mahajan, R., K. Brown, and V. Atluri, "The Evolution of Microprocessor Packaging", Intel Technology Journal, Q3, 2000, pp.

Mahajan, R., R. Nair, V. Wakharkar, J. Swan, J. Tang, and G. Vandentop, "Emerging Directions for Packaging Technologies", Intel Technology Journal, vol. 6, Issue 2, May 2002, pp. 62-75.

McCormick, A., "Pins & Vias: New Processes, Materials Extend Flexible Circuit Use", [online], May 2003, [Retrieved on Jul. 14, 2004], retrieved from the Internet at <http://neasia.nikkeibp.com/nea/200305/manu_244639.html>.

D. Mallik, et al., "Advanced Package Technologies for High-Performance Systems", Intel Corp., Intel Technology Journal, vol. 9, Issue 4, Nov. 2005, pp. 259-272.

* cited by examiner

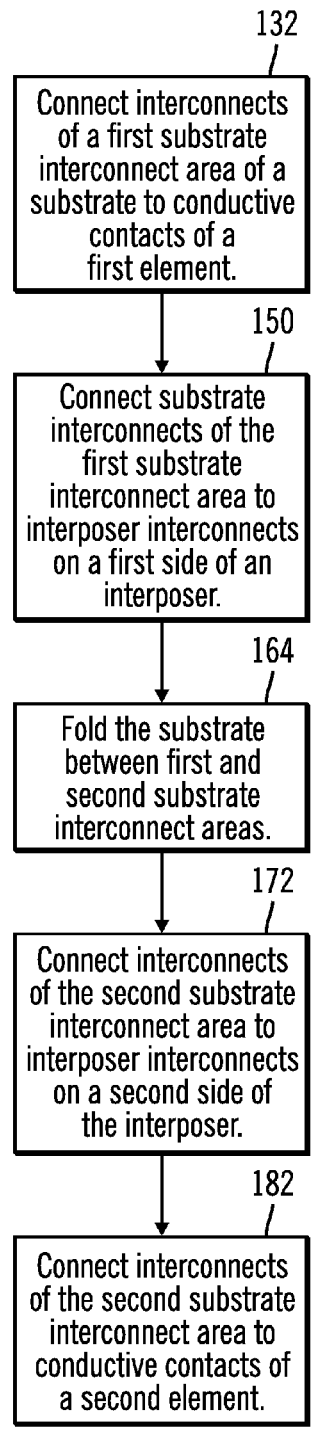
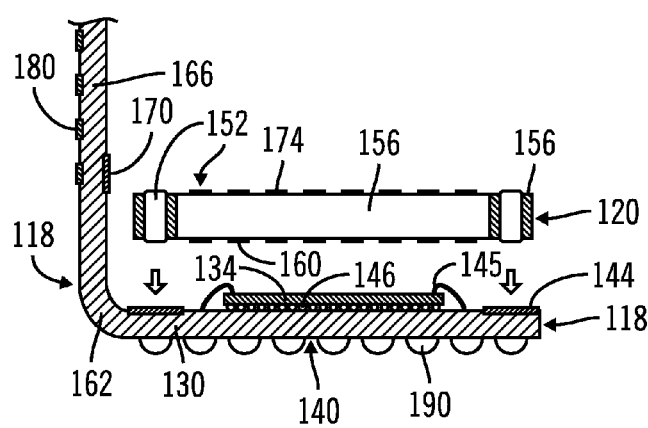
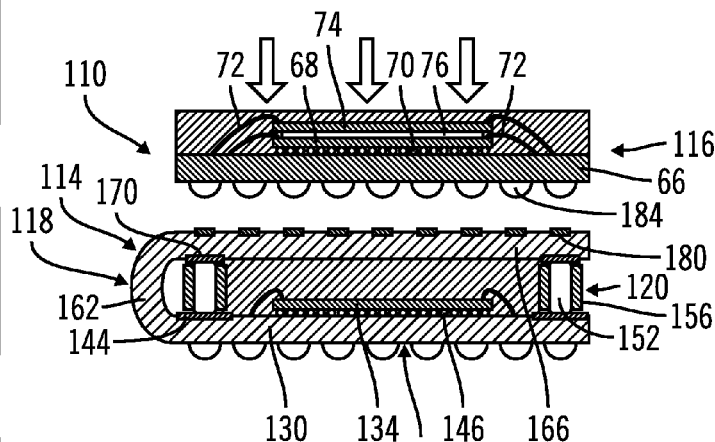
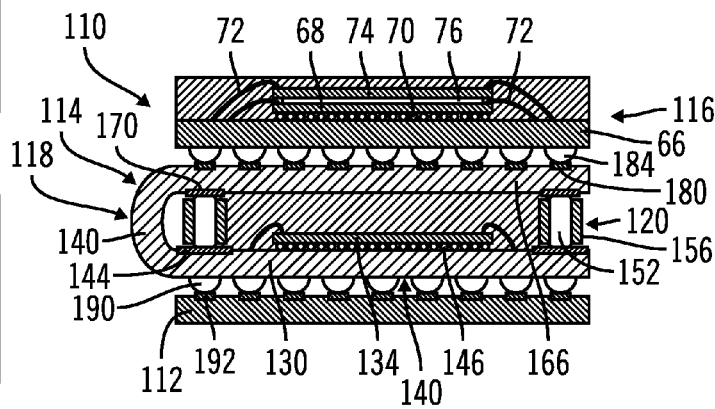
FIG. 4
FIG. 5A
FIG. 5B
FIG. 5C

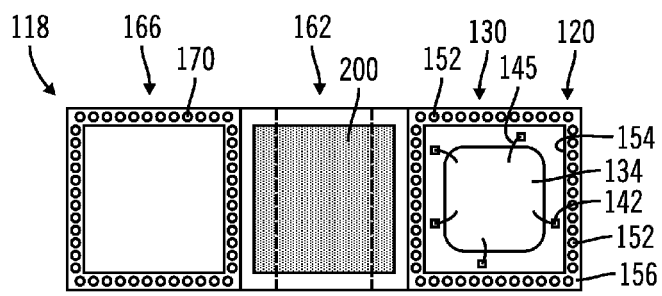
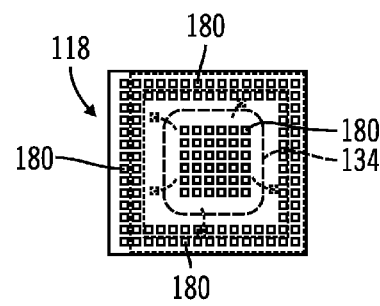
FIG. 6A  FIG. 6B
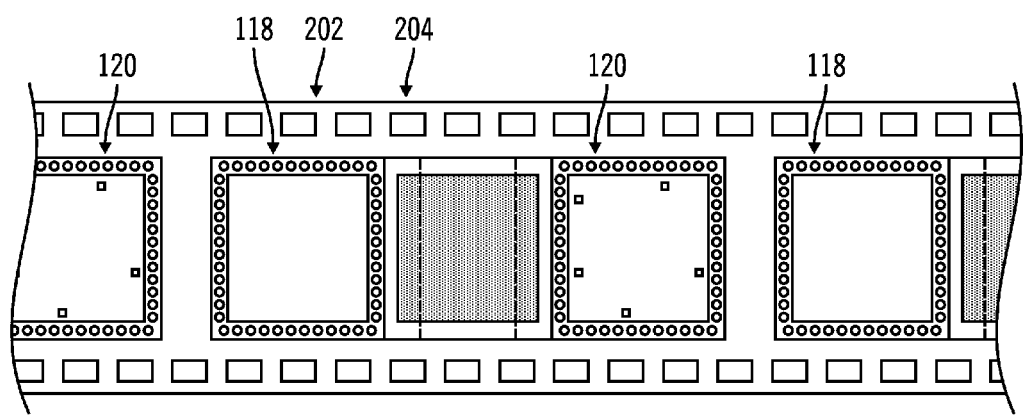
FIG. 7

FOLDED SUBSTRATE WITH INTERPOSER PACKAGE FOR INTEGRATED CIRCUIT DEVICES

DESCRIPTION OF RELATED ART

Integrated circuits typically include various active and passive circuit elements which have been integrated into a piece of semiconductor material, often referred to as a die. The die may, in turn, be encapsulated into a package, which often includes an organic or plastic substrate although other materials may be used. These packages are usually attached to a printed circuit board, often by connection terminals such as connection pins arranged along the exterior of the package. In this manner, an electronic system can be assembled by connecting various integrated circuit packages to a printed circuit board.

To increase space utilization, two or more integrated circuit dies may be attached to a printed circuit board in a stacked arrangement. The dies may be interconnected in a die-to-die stacked arrangement. Alternatively, each die may be placed in a package and the two packages may be stacked in a package-to-package arrangement. FIG. 1a shows an exploded view of one such known package-to-package stack indicated generally at 10. The stack 10 includes a first integrated circuit package 12, and a second integrated circuit package 14 which are physically and electrically connected together as shown in FIG. 1b using an interposer 16.

The integrated circuit package 12 includes a package substrate 20 on which an integrated circuit die 22 is mechanically and electrically connected by a plurality of solder bumps 24. Similarly, the integrated circuit package 14 includes a package substrate 26 to which an integrated circuit die 28 is mechanically and electrically connected by a plurality of solder bumps 30. Other electrical connectors including wires may be used in place of or in addition to the solder bumps 24, 30. The package substrates 20, 26 may have both internal and exterior conductors which are electrically connected to the solder bumps 24, 30 or to contact pads on the dies 22, 28.

The dies 22, 28 may be encapsulated in a polymer such as an epoxy layer 32 depicted for the die 28. The inputs and outputs of the stack 10 may be electrically connected to a printed circuit board using connection pins, solder bumps or other connection terminals.

As best seen in FIG. 1c, the interposer 16 includes a generally rectangular ring-shaped frame 34 which may be constructed of a dielectric material such as plastic or ceramic, for example. The frame 34 has a plurality of apertures distributed about its periphery into which plug-shaped interconnectors 36 may be punched into the frame apertures and secured therein in an interference fit. The interconnectors 36 are typically formed of an electrically conductive material such as copper and may each be bonded to aligned contact pads 40 and 42 of the package substrates 20 and 26, respectively, as shown in FIG. 1b. The copper interconnectors 36 may be bonded to the contact pads 40, 42 of the package substrates 20, 26 using stencil printed solder or other materials including electroplated solder, ink jet solder or adhesives or using other bonding techniques including thermocompression and thermosonic joining.

Each interconnector 36 can provide a separate signal path between the packages 12 and 14. Interposers may be also used to provide die-to-die or die-to-package substrate interconnections.

FIG. 2a shows an exploded view of another known package-to-package stack indicated generally at 50. The stack 50 includes a first integrated circuit package 52, and a second integrated circuit package 54 which are physically and electrically connected together as shown in FIG. 2b using a foldable, flexible substrate 56 of the package 52. In addition to package to package interconnections, folded substrates may be used to provide die-to-die or die-to-package substrate interconnections.

The foldable substrate 56 includes a first substrate interconnect area 60 on which an integrated circuit die 62 is mechanically and electrically connected by a plurality of solder bumps 64. Similarly, the integrated circuit package 54 includes a package substrate 66 to which an integrated circuit die 68 is mechanically and electrically connected by a plurality of solder bumps 70. Other electrical connectors including wires 72 may be used in place of or in addition to the solder bumps 64, 70 to connect the dies to the substrates.

The package 54 includes a third die 74 stacked on the die 68 with a spacer layer 76 therebetween. Additional wires 72 connect the die 74 to the package substrate 66. The package substrates 56, 66 may have both internal and exterior conductors which are electrically connected to the solder bumps 64, 70, wires 72 or to contact pads on the dies 62, 68, 74.

The dies 62, 68 and 74 may be encapsulated in polymers such as an epoxy layer 78 depicted for the die 64. The inputs and outputs of the stack 50 may be electrically connected to a printed circuit board using connection pins, solder bumps or other connection terminals represented at 80 extending from the interconnect area 60 of the foldable substrate 56.

The substrate 56 includes a foldable, flexible area 82 which permits a second substrate interconnect area 84 of the substrate 56 to be folded over and attached to the top of the encapsulation layer 78 using a layer 86 of adhesive. The inputs and outputs of the package 54 may be mechanically and electrically connected to the substrate area 84 of the foldable substrate 56 using appropriate connection terminals represented at 90 extending from the substrate 66 of the package 54.

The substrate 56 has flexible conductor traces deposited on the foldable area 82 which electrically connect the substrate interconnect area 84 to the substrate interconnect area 60. The typical center to center spacing or "pitch" between adjacent conductor traces may be smaller than the typical center to center spacing of the interconnects 36 of an interposer in many applications. Thus, a folded substrate can often provide a greater number of signal paths than the interconnects of an interposer.

BRIEF DESCRIPTION OF THE DRAWINGS

Referring now to the drawings in which like reference numbers represent corresponding parts throughout:

FIG. 4 illustrates one example of operations to form a package comprising a folded substrate and an interposer in accordance with one embodiment of the present description;

FIGS. 5a-5c are schematic cross-sectional views of operations to form a package comprising a folded substrate and an interposer in accordance with one embodiment of the present description;

FIG. 6a is a schematic top view of a package comprising a foldable substrate and an interposer in accordance with one embodiment of the present description, in which the substrate is in an unfolded position;

FIG. 6b is a schematic top view of a package comprising a foldable substrate and an interposer in accordance with one embodiment of the present description, in which the substrate is in a folded position;

FIG. 7 is a schematic top view of an operation of attaching a reel of interposers to a reel of foldable substrates in accordance with one embodiment of the present description.

DETAILED DESCRIPTION OF THE ILLUSTRATED EMBODIMENTS

In the following description, reference is made to the accompanying drawings which form a part hereof and which illustrate several embodiments of the present disclosure. It is understood that other embodiments may be utilized and structural and operational changes may be made without departing from the scope of the present description.

Figure 3:
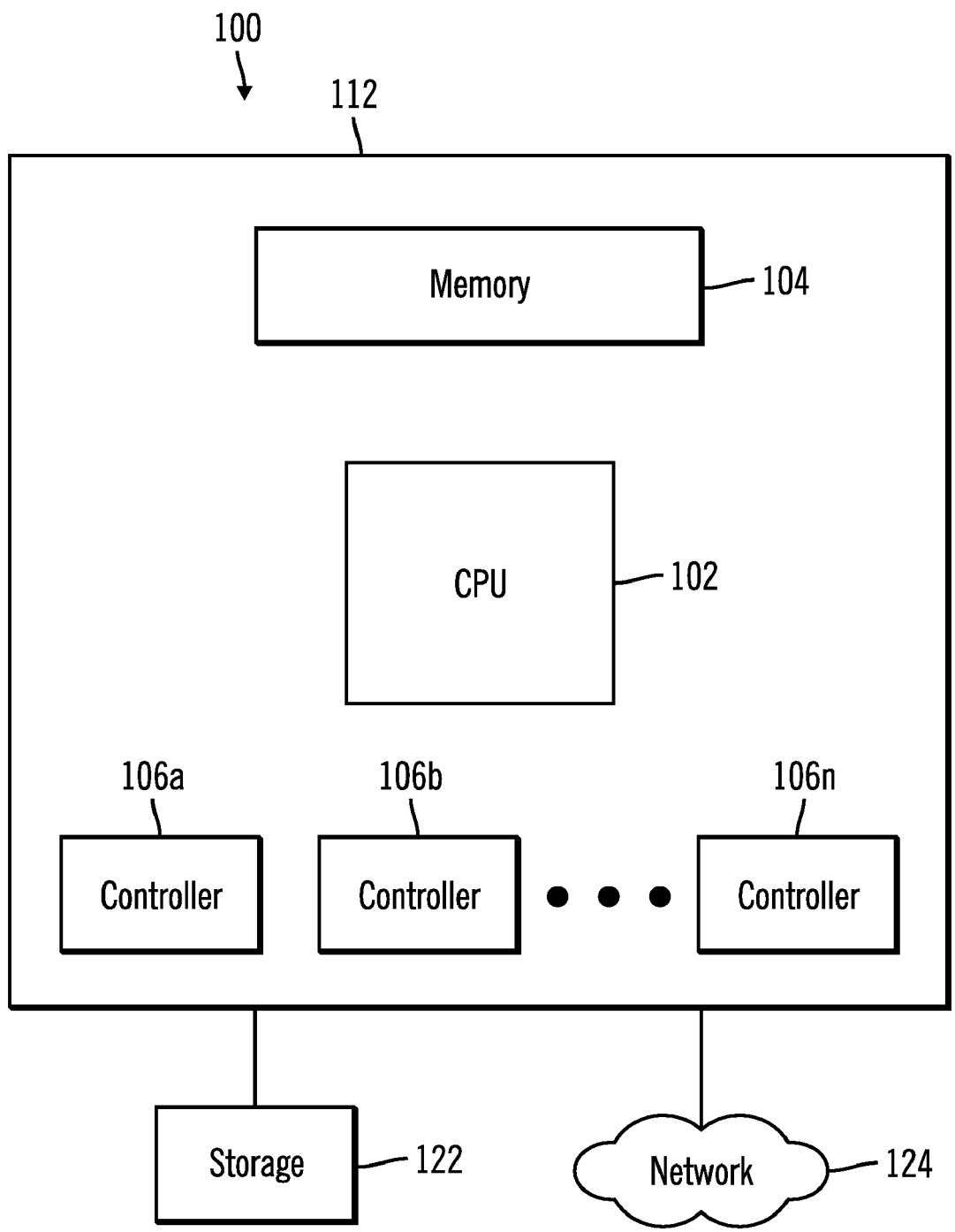
FIG. 3 illustrates one embodiment of a computing environment in which aspects of the description provided herein are embodied.

FIG. 3 illustrates a computing environment in which aspects of described embodiments may be embodied. A computer 100 includes one or more central processing units (CPU) 102 (only one is shown), a memory 104 and a plurality of controllers 106a, 106b . . . 106n. Each of the CPU 102, and controllers 106a, 106b . . . 106n include one or more electronic devices. Once such electronic device is represented by an electronic device 110 (FIG. 5c) which is electrically and mechanically coupled to a printed circuit board 112. The device 110 of this embodiment includes a package-to-package stack comprising a first integrated circuit package 114, and a second integrated circuit package 116 which are mechanically and electrically connected using both a folded substrate 118 and an interposer 120 of the package 114. As explained in greater detail below, the folded substrate 118 and the interposer 120 may provide, in one application, a combination of different types of signal paths of varying capabilities between the two packages 114 and 116. It is appreciated that in other applications, additional or different features may be utilized.

The printed circuit board 112 may be a single layer or multi-layered motherboard which has a plurality of conductive lines that provide communication between the circuits in the device 110 and other components mounted to the board 112. Alternatively, one or more of the CPU 102, memory 104 and controllers 106a, 106b . . . 106n may be disposed on other cards such as daughter cards or expansion cards.

An operating system and various applications execute on the CPU 102 and reside in the memory 104. The content residing in memory 104 may be cached in accordance with suitable caching techniques. Programs and data in memory 104 may be swapped into storage 122 as part of memory management operations. The computer 100 may comprise any suitable computing device, such as a mainframe, server, personal computer, workstation, laptop, handheld computer, telephony device, network appliance, virtualization device, storage controller, network controller, etc. Any suitable CPU 102 and operating system may be used.

The controllers 106a, 106b . . . 106n may include a system controller, peripheral controller, memory controller, hub controller, I/O bus controller, video controller, network controller, storage controller, etc. For example, a storage controller can control the reading of data from and the writing of data to a storage 122 in accordance with a storage protocol layer. The storage protocol of the layer may be any of a number of suitable storage protocols. Data being written to or read from the storage 106 may be cached in accordance with suitable caching techniques.

A network controller can include one or more protocol layers to send and receive network packets to and from remote devices over a network 124. The network 124 may comprise a Local Area Network (LAN), the Internet, a Wide Area Network (WAN), Storage Area Network (SAN), etc. Embodiments may be configured to transmit data over a wireless network or connection such as a cellular phone network or a Wireless Fidelity (Wi-Fi) Ethernet network. In certain embodiments, the network controller and various protocol layers may employ the Ethernet protocol over unshielded twisted pair cable, token ring protocol, Fibre Channel protocol, etc., or any other suitable network communication protocol.

FIGS. 4 and 5a-5f show an example of operations for fabricating the device 110 comprising the first integrated circuit package 114, and the second integrated circuit package 116 which are mechanically and electrically connected using both the foldable substrate 118 and the interposer 120 of the package 114. In one operation, interconnects of a first interconnect area 130 of the substrate 118 are connected (block 132, FIG. 4) to conductive contacts of a first element. In the illustrated embodiment, the first element is represented by an integrated circuit die 134. It is appreciated that the first element may be other elements such as an integrated circuit package or a substrate for an integrated circuit.

Figure 2A:
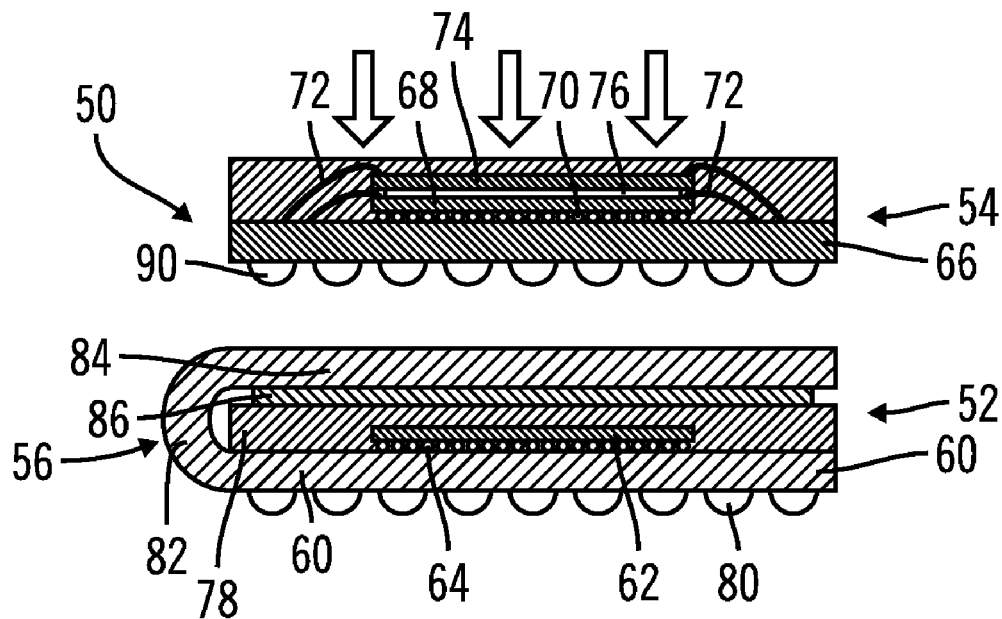
FIGS. 2a and 2b schematically illustrate a prior art foldable substrate connecting integrated circuit packages in a package-to-package stack.

The substrate 118 may be similar to the substrate 56 of FIG. 2a. In the illustrated embodiment, the substrate 118 includes a tape-shaped core 140 which may include a relatively flexible, electrically insulative material such as polyimide or liquid crystal polymer (LCP), a thermoplastic polyester. It is appreciated that other types of flexible or inflexible, insulative or conductive materials may be used for a core such as the core 140, depending upon the particular application.

In the illustrated embodiment, the core 140 is relatively thin, within a range of 10 um-100 um, such as 25 um, for example, to facilitate folding the core 140. It is appreciated that other thicknesses may be utilized as well.

Disposed within the core 140, or disposed on the surface of the core 140, or disposed both within and on the core 140 are a plurality of conductors which conduct electrical signals within the device 110. The signals conducted by the conductors of the substrate 118 may include one or more of analog signals, digital signals, DC signals, signals of various frequencies, power signals, biasing signals, ground, etc.

In the illustrated embodiment, the conductors are formed of an electrically conductive material such as a copper, for example. It is appreciated that other types of conductive materials such as aluminum or gold may be used. In some applications, a nonmetal conductive material may be utilized. The degree of conductivity, and other properties may vary, depending upon the particular application. It is appreciated that the substrate 118 may be fabricated using a variety of suitable techniques and materials including those known to those skilled in the art.

These conductors of the substrate 118 include interconnects such as pads 142 (FIG. 6a) disposed within the substrate interconnect area 130 of the substrate 118. Wires 145 or other conductors may be used to connect the pads 142 of the substrate area 130 to the integrated circuit die 134. In addition, solder bumps 146 or other conductors may be used to connect interconnects within the substrate interconnect area 130 of the substrate 118 to the integrated circuit die 134.

Figure 1A:
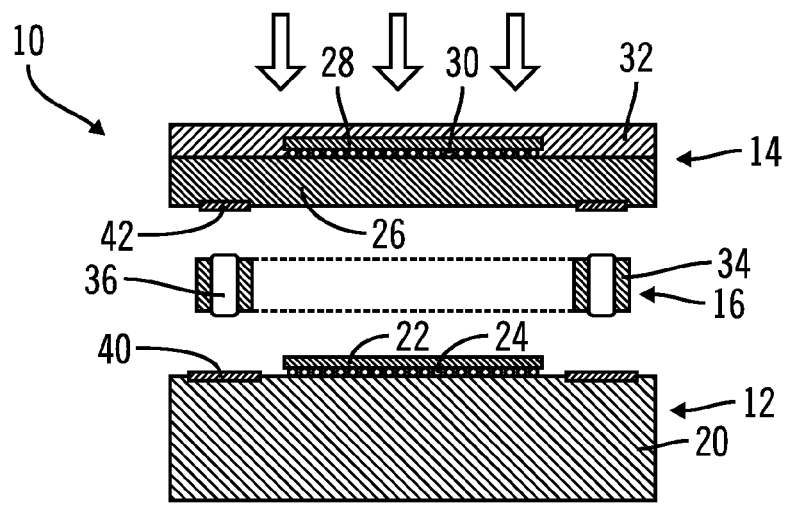
FIGS. 1a and 1b schematically illustrate a prior art interposer connecting integrated circuit packages in a package-to-package stack.
Figure 1B:
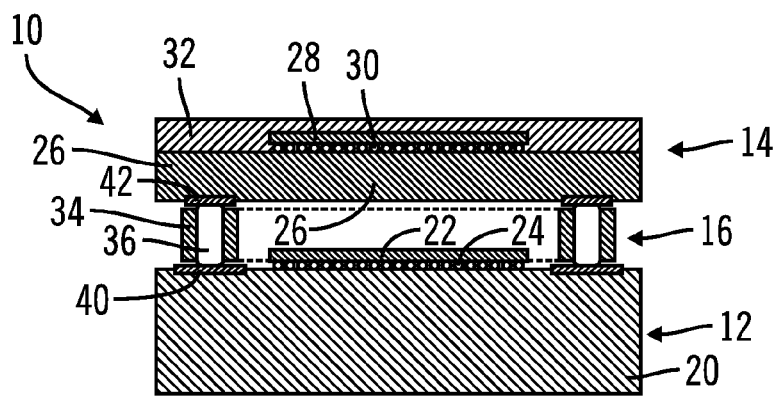
Figure 1C:
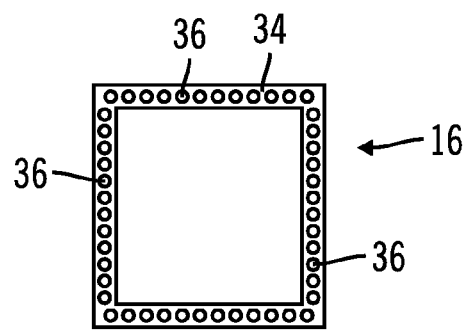
FIG. 1c is a top schematic view of the prior art interposer of FIGS. 1a and 1b.

In another operation, interconnects such as interconnects 144 of the interconnect area 130 of the substrate 118 are connected (block 150, FIG. 4) to interposer interconnects 152 of an interposer such as the interposer 120 of FIG. 5*b*. The interposer 120 may be similar to the interposer 16 of FIG. 1*c*. In the illustrated embodiment, interposer 120 is depicted as being generally rectangular in shape (FIG. 6*a*) and having a generally rectangular interior window 154. The integrated circuit die 134 is received within the interposer window 154 and is encircled by the interposer 120 as shown in FIG. 6*a*. It is appreciated that the interposer 120 may have a variety of different shapes, depending upon the particular application.

In the illustrated embodiment, the foldable substrate 118 of the device 110 once folded as shown in FIG. 6*b*, may be relatively small in size to facilitate use in portable or hand-held applications such as laptop computers, personal digital assistants or cellular phones, for example. The folded substrate 118 of the device 110 may have a top area (FIG. 6*b*) which is less than 30 mm$^2$ or less than 25 mm$^2$, for example, such that the device 110 may occupy less than 30 mm$^2$ or less than 25 mm$^2$ of the circuit board 112. The device 110 may have other applications including portable and nonportable as well and applications in which the substrate 118 in the folded position has a top area size in excess of 25 or 30 mm$^2$. For example, the device 110 may be used in mainframe and server applications which are typically nonportable.

The interconnects 152 of the illustrated embodiment are generally cylindrical or plug-shaped conductors press-fit into apertures formed within the body 156 of the interposer 120. It is appreciated that the interposer 120 may be fabricated using a variety of suitable techniques and materials including those known to those skilled in the art. For example, the interconnects 152 may be formed by vias within the interposer core or body 156 in which the vias are filled or coated with a conductive material. In the illustrated embodiment, the body 156 of the interposer 120 is formed of a relatively stiff and electrically insulative material such as a polyimide or an epoxy such as High Tg FR-4 (BT). It is appreciated that other types of flexible or inflexible, insulative or conductive materials may be used for an interposer body such as the body 156, depending upon the particular application.

In the illustrated embodiment, the interposer interconnects 152 are formed of an electrically conductive material such as a copper, for example. The interconnects 152 may have a conductive coating such as a tin coating, for example, to facilitate interconnection with the folded substrate 118. It is appreciated that other types of conductive materials such as aluminum or gold may be used. In some applications, a nonmetal conductive material may be utilized. The degree of conductivity, and other properties may vary, depending upon the particular application.

The interconnects 144 of the interconnect area 130 include contact pads in the illustrated embodiment. The interposer 120 may be connected with the area 130 of the substrate 118 with the end 160 (FIG. 5*a*) of each interconnect 152 bonding to an associated contact pad of an interconnect 144 of the substrate 118 as shown in FIG. 5*b*. In the illustrated embodiment, for example, the interposer 120 and the area 130 of the substrate 118 are compressed together with a suitable compressive force and application of heat. The interposer interconnects 152 are diffusion bonded, metal to metal, with the associated interconnects 144 of the substrate 118. It is appreciated that the interposer 120 may be joined and bonded to the substrate 118 using a variety of techniques. An appropriate joining and bonding may be achieved by those skilled in the electronic device packaging art.

The integrated circuit die 134 may be encapsulated in a polymer such as an epoxy layer 161. The integrated circuits of the die 134 may contain memory, logic or other elements as is known in the art. The die 134 of the package 114 may be encapsulated before or after the interposer 120 is bonded to the interconnect area 130 of the substrate 118. In some applications, the die 134 may be not be encapsulated. It is appreciated that a variety of encapsulation techniques and materials may be employed by those skilled in the art, depending upon the particular application.

In a further operation, a flexible area 162 of the substrate 118 may be folded (block 164) as shown in FIG. 5*b*, for example. In the illustrated embodiment, the substrate 118 has a second interconnect area 166 with the flexible area 162 disposed between the interconnect areas 130 and 166 as shown in FIG. 6*a*. The flexible area 162 may be folded so that the interconnect area 166 of the substrate 118 is facing a second side of the interposer 120.

In another operation, interconnects 170 of the interconnect area 166 of the substrate 118 are connected (block 172, FIG. 4) to the interposer interconnects 152 of the interposer 120 of FIG. 5*b*. The interconnects 170 of the interconnect area 166 include contact pads in the illustrated embodiment. The interposer 120 may be connected with the area 166 of the substrate 118 with the end 174 (FIG. 5*a*) of each interconnect 152 bonding to an associated contact pad of an interconnect 170 of the substrate 118 as shown in FIG. 5*b*. In the illustrated embodiment, for example, the interposer 120 and the area 166 of the substrate 118 are compressed together with a suitable compressive force and application of heat. The interposer interconnects 152 are diffusion bonded, metal to metal, with the associated interconnects 170 of the substrate 118. Again, it is appreciated that the interposer 120 may be joined and bonded to the substrate 118 using a variety of techniques.

Figure 2B:
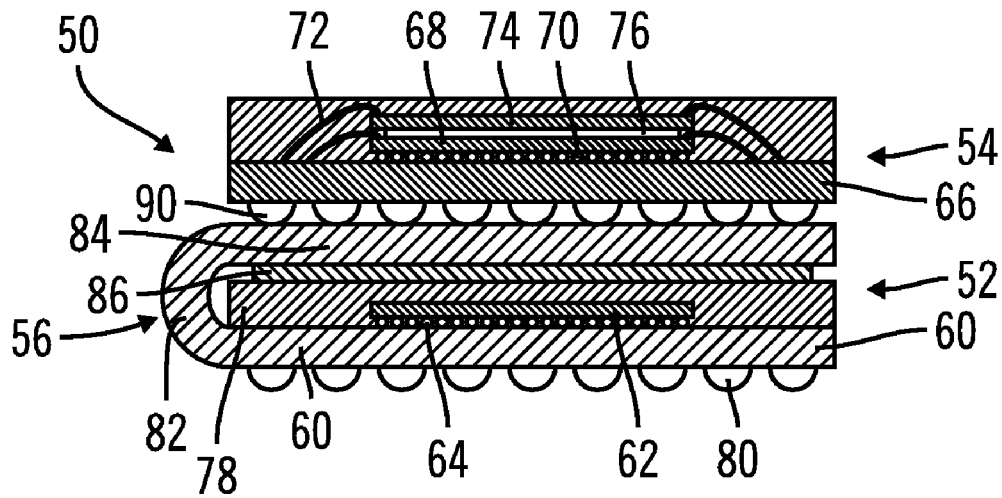

In a further operation, interconnects 180 of the second interconnect area 166 of the substrate 118 are connected (block 182, FIG. 4) to conductive contacts 184 of a second element. In the illustrated embodiment, the second element is represented by an integrated circuit package 116 which is similar to the integrated circuit package 54 of FIGS. 2*a*, 2*b*. It is appreciated that the second element may be other elements such as an integrated circuit die or a substrate for an integrated circuit.

The interconnects 180 of the interconnect area 166 may include contact pads which, in the illustrated embodiment, may be disposed in a two dimensional array over a substantial portion of the top of the interconnect area 166 as shown in FIG. 6*b*. The contacts 184 of the integrated circuit package 116 are ball-shaped conductors disposed in a ball grid array (BGA) in the illustrated embodiment. It is appreciated that other types of conductors such as a pin grid array (PGA) may be used. The integrated circuit package 116 may be connected with the area 166 of the substrate 118 with each contact 184 engaging or bonding to an associated contact pad of an interconnect 180 of the substrate 118 as shown in FIG. 5*c*. In the illustrated embodiment, for example, the package 116 and the area 166 of the substrate 118 are compressed together with a suitable compressive force and application of heat. Again, it is appreciated that the integrated circuit package 116 may be connected to the substrate 118 using a variety of techniques. An appropriate connection may be achieved by those skilled in the electronic device packaging art.

In another operation, the device 110 may be connected to a printed circuit board such as the board 112. The substrate 118 of the device 110 has a plurality of contacts 190 which are ball-shaped conductors in a BGA in the illustrated embodiment. It is appreciated that other types of conductors may be used. The device 110 may be connected to the printed circuit board 112 with each contact 190 engaging or bonding to an associated contact pad 192 of the printed circuit board 112 as shown in FIG. 5c. An appropriate connection may be achieved by those skilled in the electronic device packaging art.

The folded substrate 118 can provide a number of signal paths from the integrated circuit package 116 to the integrated circuit package 114 and the printed circuit board 112. Many of these signal paths are provided at least in part by conductors 200 (FIG. 6a) formed on or in the flexible area 162 of the substrate 118. The conductors 200 interconnect conductors within the substrate areas 130 and 166, through the foldable area 162. These conductors 200 can be sufficiently flexible to permit folding of the substrate area 162 without breaking the conductors 200. For example, the conductors 200 may be formed by deposition of a conductive copper film on the substrate 118 and etching the film to form the appropriate conductor traces. The conductors 200 may be relatively thin, such as within a range of 5 um-100 um, for example and relatively narrow such as within a range of 5 um-100 um, for example. Such a technique can produce many flexible signal paths, such as 80-170, for example, depending upon a number of factors including the width of the individual conductor traces, the particular design rules being applied and the types of signals being carried. It is appreciated that other techniques may be used to form conductors in and on the substrate 118.

Many of the signal paths from the integrated circuit package 116 to the integrated circuit package 114 and the printed circuit board 112 can also be provided at least in part by the interconnects 152 of the interposer 120 (FIG. 5c). The interconnects 152 interconnect conductors within the substrate areas 130 and 166, and can bypass the folded substrate area 162. These conductive interconnects 152 can be sized to provide a type of signal path which can be complementary to the signal paths provided through the folded substrate area 162. For example, in some applications, the interposer interconnects 152 can be made relatively thick (within a range of 10 um-1.2 mm, for example) to provide a relatively low resistance current path having a relatively high current carrying capability. Moreover, the interconnects can be spaced relatively widely to reduce interference between adjacent signal paths through the interposer 120. Still further, these signal paths can be made relatively short between the substrate areas 130 and 166, and can be shorter than the signal paths through the folded area 162 of the substrate 118. However, it is appreciated that a number of different types of signal paths may be devised, depending upon the particular application. These signal paths may pass through one or both of the interposer 120 and the folded area 162 of the substrate 118.

The folded substrate 118 may be manufactured using suitable techniques including those known to those skilled in the art. For example, the substrate 118 may be manufactured in a reel-to-reel process. Similarly, the interposer 120 may be manufactured using suitable techniques including those known to those skilled in the art. For example, the interposer 120 may be manufactured in a reel-to-reel process with automated punching to form apertures in the interposer frame body 156 and automated implanting of the interconnects 152 into the frame apertures. Still further, a reel 202 of interposers 120 may be overlaid on a reel 204 of substrates 118 to facilitate bonding the interposers 120 and substrates 118 together as shown in FIG. 7.

Additional Embodiment Details

In certain embodiments, the package embodiments may be embodied in a computer system which includes a video controller to render information to display on a monitor wherein the computer system may be a desktop, workstation, server, mainframe, laptop, handheld computer, handheld wireless telephone, etc. Alternatively, the interposer embodiments may be embodied in a computing device that does not include a video controller, such as a switch, router, etc.

The illustrated operations of FIGS. 4, 5a-5c show certain events occurring in a certain order. In alternative embodiments, certain operations may be performed in a different order, modified or removed. Moreover, operations may be added to the above described operations and still conform to the described embodiments. Further, operations described herein may occur sequentially or certain operations may be processed in parallel.

Figure 8:
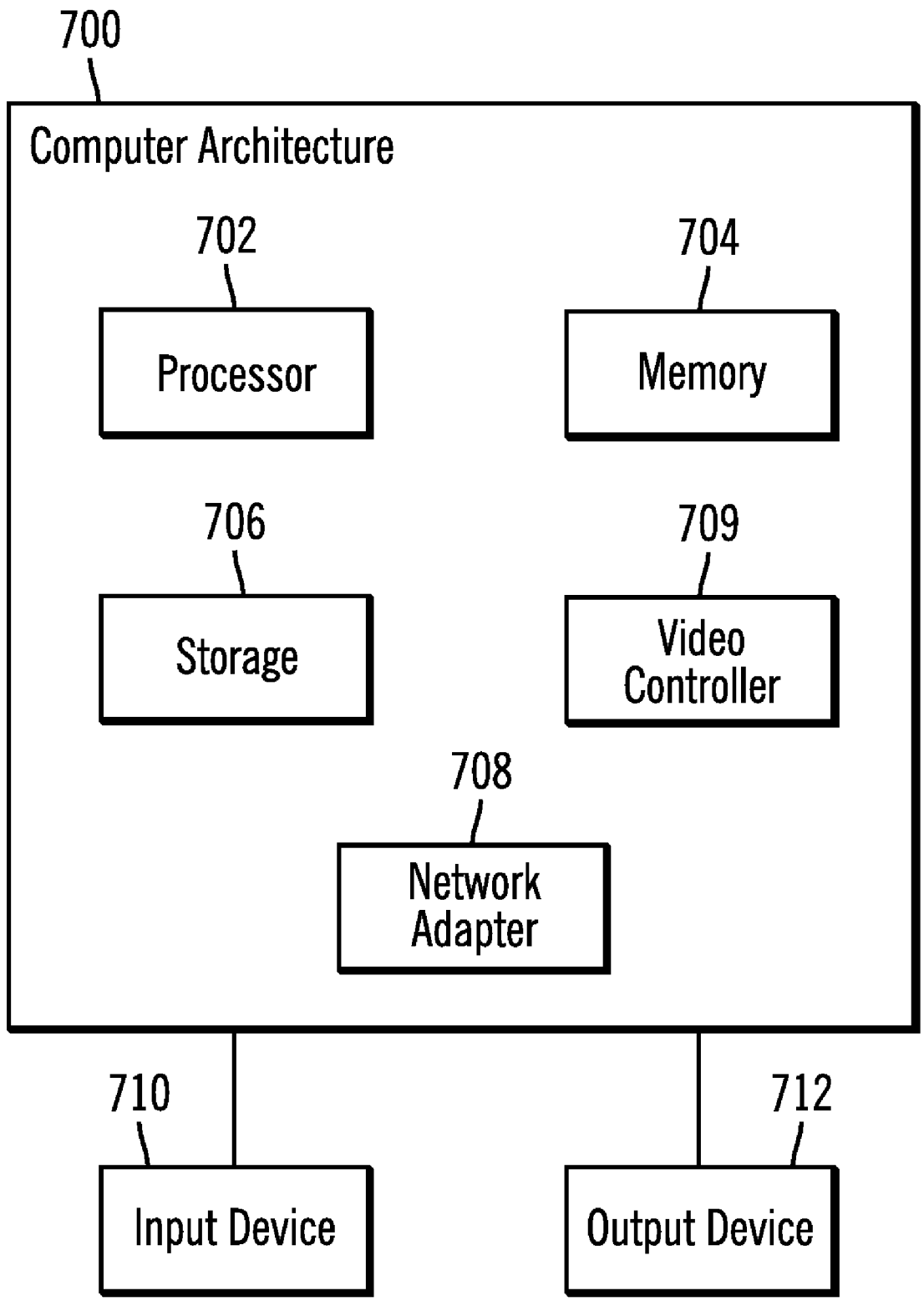
FIG. 8 illustrates an architecture that may be used with the described embodiments.

FIG. 8 illustrates one embodiment of a computer architecture 700 which can utilize components, such the devices shown in FIG. 3. One or more components or devices may utilize a package comprising an interposer and folded substrate in accordance with the description provided herein.

The architecture 700 may include a processor 702 (e.g., a microprocessor), a memory 704 (e.g., a volatile memory device), and storage 706 (e.g., a nonvolatile storage, such as magnetic disk drives, optical disk drives, a tape drive, flash memory, etc.). The processor 702 may be mounted on a motherboard, for example. The storage 706 may comprise an internal storage device or an attached or network accessible storage. Programs in the storage 706 are loaded into the memory 704 and executed by the processor 702 in a suitable manner. The architecture further includes a network adapter 708 to enable communication with a network, such as an Ethernet, a Fibre Channel Arbitrated Loop, cellular telephone, etc. Further, the architecture may, in certain embodiments, include a video controller 709 to render information on a display monitor, where the video controller 709 may be embodied on a video card or integrated on integrated circuit components mounted on the motherboard. Certain of the devices may have multiple cards or controllers. An input device 710 is used to provide user input to the processor 702, and may include a keyboard, mouse, pen-stylus, microphone, touch sensitive display screen, or any other suitable activation or input mechanism including those known in the art. An output device 712 is capable of rendering information transmitted from the processor 702, or other component, such as a display monitor, printer, storage, etc.

The network adapter 708 or other devices described herein may be mounted on an expansion card, such as a Peripheral Component Interconnect (PCI) card, PCI-express or some other I/O expansion card coupled to a motherboard, or on integrated circuit components mounted on the motherboard. Devices may be mounted directly to a card or may utilize a package having a folded substrate and an interposer in accordance with the description provided herein. Thus, package embodiments may be embodied in computer systems or other systems in which a package in accordance with the present description is mounted on one or both of a motherboard and an expansion card. Accordingly, in some system embodiments, the system may lack an expansion card, and a package in accordance with the present description may be mounted on a motherboard. In another system embodiment, a package in accordance with the present description may be mounted on an expansion card but not on a motherboard.

Details on the PCI architecture are described in "PCI Local Bus, Rev. 2.3", published by the PCI-SIG. Details on the Fibre Channel architecture are described in the technology specification "Fibre Channel Framing and Signaling Interface", document no. ISO/IEC AWI 14165-25. Details on the Ethernet protocol are described in publications including "IEEE std. 802.3," published Mar. 8, 2002, and "IEEE std. 802.11," published 1999-2003.

The foregoing description of various embodiments has been presented for the purposes of illustration and explanation. It is not intended to be exhaustive or to limit to the precise form disclosed. Many modifications and variations are possible in light of the above teaching. For example, an interposer in accordance with the present disclosure may be used to connect a die to a substrate.

What is claimed is:

1. A device, comprising:
    an interposer having a core and a plurality of plug-shaped interposer interconnects disposed within said interposer core; and
    a substrate having a folded foldable area having a plurality of conductors passing through said foldable area; said substrate further having a first interconnect area having a first plurality of interconnects at least some of which are connected to said interposer interconnects on a first side of said interposer, and a second interconnect area having a second plurality of interconnects at least some of which are connected to said interposer interconnects on a second side of said interposer;
    wherein the interposer interconnects have a resistance lower than that of the conductors passing through said foldable area and wherein the interposer interconnects have a current carrying capability higher than that of the conductors passing through said foldable area.

2. The device of claim 1 further comprising:
    a first element selected from a group consisting of an integrated circuit package, an integrated circuit die, a substrate for an integrated circuit, wherein said first element has conductive contacts connected to at least some of said interconnects of said first substrate interconnect area; and
    a second element selected from a group consisting of an integrated circuit package, an integrated circuit die, a substrate for an integrated circuit, wherein said second element has conductive contacts connected to at least some of said interconnects of said second substrate interconnect area.

3. The device of claim 2 wherein said first element is an integrated circuit die.

4. The device of claim 3 further comprising an encapsulation layer encapsulating said integrated circuit die of said first element.

5. The method of claim 2 wherein said second element is an integrated circuit package.

6. The device of claim 2 wherein said interposer defines a window and said first element is disposed within said interposer window.

7. The device of claim 2 wherein said conductive contacts of said second element are a ball grid array.

8. The device of claim 2 wherein said device is a stacked package.

9. The device of claim 2 wherein said conductive contacts of said first element are a ball grid array.

10. The device of claim 1 wherein said interposer core defines apertures and wherein said interposer interconnects are conductor plugs press-fit into said apertures of said interposer core.

11. A portable system, comprising:
    a circuit board
    an input electrically coupled to said circuit board;
    an output electrically coupled to said circuit board; and
    an interposer having a core and a plurality of plug-shaped interposer interconnects disposed within said interposer core; and
    an electronic device disposed on said circuit board and occupying less than 30 mm$^2$ of said circuit board, said device having a substrate having a folded foldable area having a plurality of conductors passing through said foldable area; said substrate further having a first interconnect area having a first plurality of interconnects at least some of which are connected to said interposer interconnects on a first side of said interposer, and a second interconnect area having a second plurality of interconnects at least some of which are connected to said interposer interconnects on a second side of said interposer, said device further having a first element selected from a group consisting of an integrated circuit package, an integrated circuit die, a substrate for an integrated circuit, wherein said first element has conductive contacts connected to at least some of said interconnects of said first substrate interconnect area, and a second element selected from a group consisting of an integrated circuit package, an integrated circuit die, a substrate for an integrated circuit, wherein said second element has conductive contacts connected to at least some of said interconnects of said second substrate interconnect area;
    wherein the interposer interconnects have a resistance lower than that of the conductors passing through said foldable area and wherein the interposer interconnects have a current carrying capability higher than that of the conductors passing through said foldable area.

12. The portable system of claim 11 wherein said first element is an integrated circuit die.

13. The portable system of claim 12 further comprising an encapsulation layer encapsulating said integrated circuit die of said first element.

14. The portable system of claim 11 wherein said second element is an integrated circuit package.

15. The portable system of claim 11 wherein said interposer core defines apertures and wherein said interposer interconnects are conductor plugs press-fit into said apertures of said interposer core.

16. The portable system of claim 11 wherein said interposer defines a window and said first element is disposed within said interposer window.

17. The portable system of claim 11 wherein said conductive contacts of said second element are a ball grid array.

18. The portable system of claim 11 wherein said device is a stacked package.

19. The portable system of claim 11 wherein said conductive contacts of said first element are a ball grid array.

20. The portable system of claim 11 wherein said portable system is a cellular telephone.

21. The portable system of claim 11 wherein said portable system is a personal digital assistant.

* * * * *